(12) United States Patent
Erickson et al.

(10) Patent No.: US 6,442,038 B1
(45) Date of Patent: Aug. 27, 2002

(54) EXPANSION CARD HOLD DOWN ASSEMBLY

(75) Inventors: Vernon D. Erickson, Dakota Dunes, SD (US); David R. Davis, Sioux City, IA (US); Thomas H. Carson, South Sioux City, NE (US); Robert S. Williams; Alejandro Puentes, both of El Paso, TX (US)

(73) Assignee: Gateway, Inc., Poway, CA (US)

( * ) Notice: Subject to any disclaimer, the term of this patent is extended or adjusted under 35 U.S.C. 154(b) by 0 days.

(21) Appl. No.: 09/637,959

(22) Filed: Aug. 11, 2000

(51) Int. Cl.$^7$ .................................................. H05K 7/14
(52) U.S. Cl. ...................... 361/759; 361/753; 361/797; 361/801; 361/825; 211/41.17; 248/221.11
(58) Field of Search .................... 361/683–686, 361/728, 747, 753, 759, 797, 801, 825; 312/223.2; 211/41.17; 248/220.21, 220.22, 221.11

(56) References Cited

U.S. PATENT DOCUMENTS

| | | | |
|---|---|---|---|
| 5,544,006 A | 8/1996 | Radloff et al. | 361/683 |
| 5,579,210 A | 11/1996 | Ruhland et al. | 361/816 |
| 5,640,309 A | 6/1997 | Carney et al. | 361/801 |
| 5,673,175 A | 9/1997 | Carney et al. | 361/686 |
| 5,694,291 A | * 12/1997 | Feightner | 361/683 |
| 5,748,453 A | 5/1998 | Carney et al. | 361/801 |
| 5,757,618 A | 5/1998 | Lee | 361/686 |
| 5,822,193 A | 10/1998 | Summers et al. | 361/759 |
| 5,822,196 A | 10/1998 | Hastings et al. | 361/801 |
| 5,890,693 A | 4/1999 | Do et al. | 248/346.03 |
| 5,909,359 A | 6/1999 | Summers et al. | 361/748 |
| 6,231,139 B1 * | 5/2001 | Chen | 312/223.2 |
| 6,278,614 B1 | 8/2001 | Beaman et al. | |

* cited by examiner

Primary Examiner—Jayprakash N. Gandhi
(74) Attorney, Agent, or Firm—Kevin E. West; Mark S. Walker; Suiter & Associates

(57) ABSTRACT

A card hold down assembly for retaining one or more expansion cards within the chassis of an electronic device such as a computer system, server, photocopier, facsimile machine, printer, or the like is described. The card hold down assembly is comprised of a retainer that engages the mounting bracket securing tab of an expansion card received in the chassis to at least partially restrain the tab for securing said expansion card in the chassis.

24 Claims, 6 Drawing Sheets

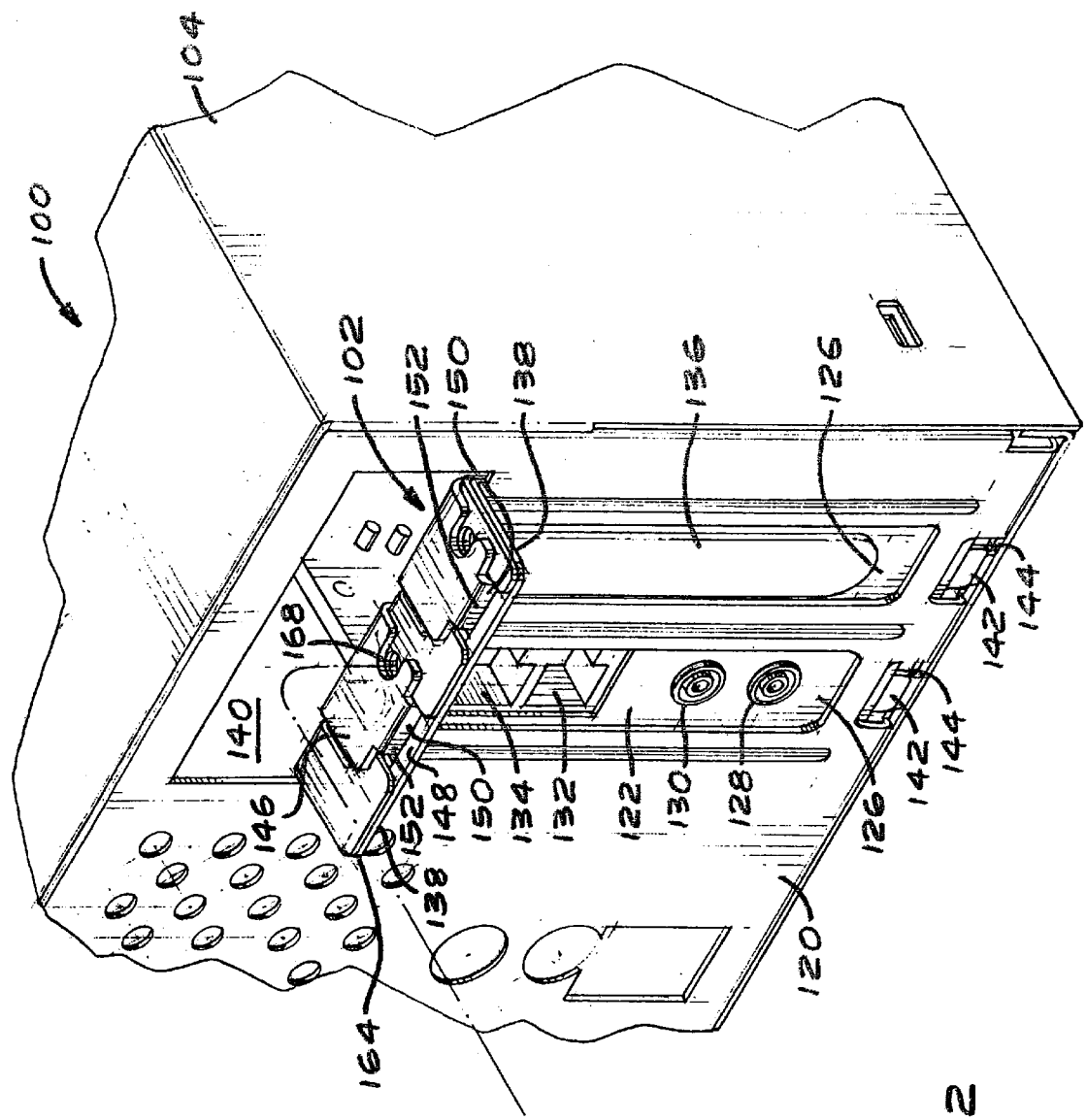
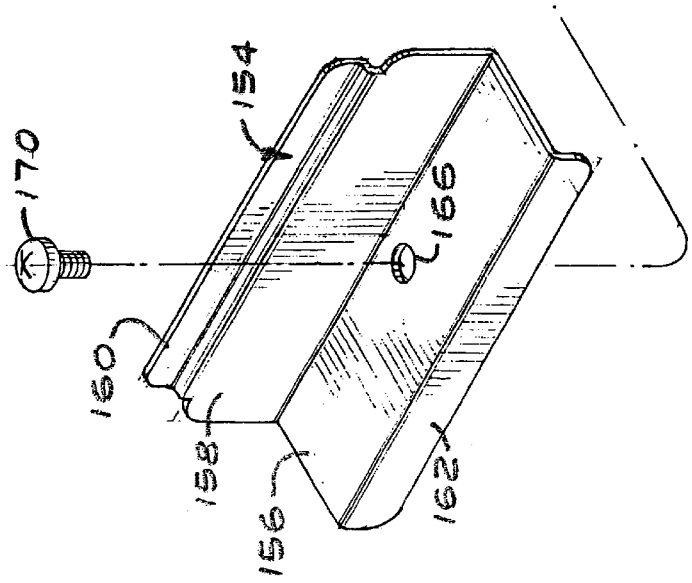
FIG. 2

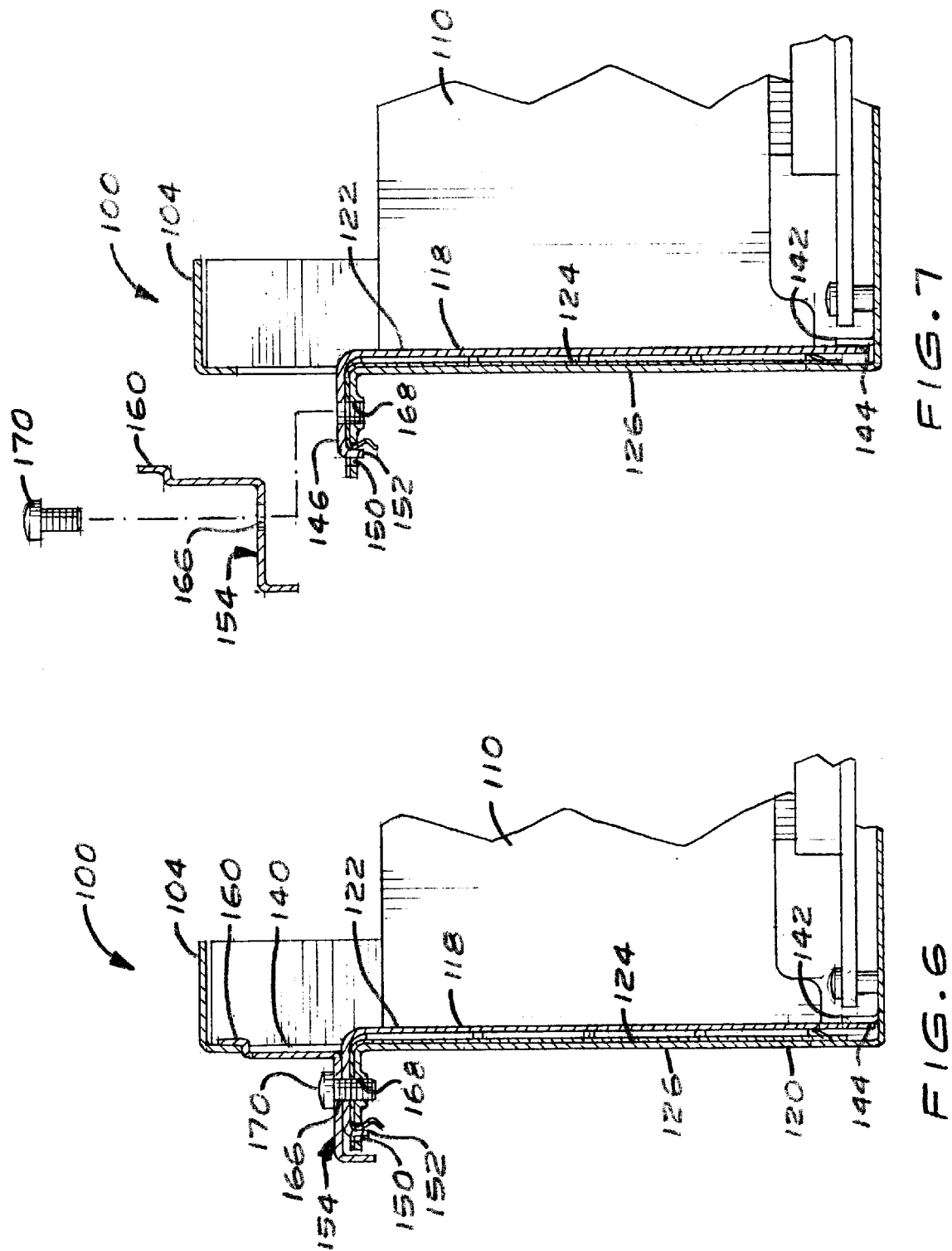

EXPANSION CARD HOLD DOWN ASSEMBLY

FIELD OF THE INVENTION

The present invention generally relates to electronic devices capable of employing expansion cards which provide specialized functions or resources to the device, or which extend the devices' ability to communicate with and/or control peripheral devices, networks, or the like. In particular, the present invention relates to an electronic device having a chassis including a card hold down assembly for retaining or securing expansion cards within the chassis.

BACKGROUND OF THE INVENTION

Electronic devices, particularly computer systems, servers, photocopiers, facsimile machines, printers, control equipment, medical equipment, telecommunication equipment, and the like often include one or more expansion cards which provide specialized functions or resources to the device, or which extend the devices' ability to communicate with and/or control peripheral devices, networks or the like. Such expansion cards typically comprise generally rectangular printed circuit boards having an edge connector formed along one side edge. The edge connector is inserted into an expansion slot disposed on a system board (often referred to in the art as a motherboard) mounted within the electronic device to couple the installed expansion card to other electronic components in the device. In typical configurations, the expansion slots are oriented so the expansion cards installed therein are arranged in a spaced apart, generally parallel array wherein end edges of the cards are aligned with each other.

Extending along the aligned end edges of the expansion cards are metal mounting brackets having outwardly bent tabs positioned adjacent to the side edges of the cards opposite the edge connector. When the expansion cards are installed within the chassis of the electronic device and seated in the expansion slot, these tabs rest against a ledge surface formed inside the chassis. Notches disposed in the tabs overlie and register with holes formed in the ledge surface allowing the mounting bracket to be secured to the surface by a screw or bolt extending through the tab notch and threaded into the hole.

Because fasteners such as a screws or bolts are used to secure the mounting bracket tabs to the ledge surface, installation and removal of expansion cards is somewhat difficult and time consuming, and requires the use of tools such as a screwdriver or wrench. As a result, it would be advantageous to eliminate the fastener, relying on the expansion slot itself to hold the expansion card in place. However, electronic devices, particularly personal computers, are often subjected to substantial shock and vibration during delivery from the manufacturer to a retailer or the consumer. If not retained therein by the fastener, this shock and vibration could cause expansion cards to become unseated from their expansion slots on the system board causing the expansion card to not function properly.

Known to the art are card retaining assemblies that employ a clamp to hold each expansion card in place. These clamps are hinged to the back panel of the computer's chassis so that they pivot through a hole formed in the back panel to hold the mounting bracket tab against the ledge surface. However, because the clamps, which are typically formed of plastic because of their complex shape, must pivot through a hole in the back panel, it becomes very difficult to provide adequate shielding against electromagnetic interference since the hole cannot be completely covered. Further, because a separate clamp is required for each expansion slot, such card retaining assemblies are relatively complex and costly to manufacture. Finally, such card retaining assemblies do not provide a means of securing the expansion card during shipping or movement of the computer system.

Consequently, it would be advantageous to provide an electronic device having a case or housing comprising apparatus for securing expansion cards within the chassis of an electronic device and allowing quick removal and installation of expansion cards without the need for individual fasteners to hold each card in place. Such a card hold down apparatus should be simple to manufacture, should provide good EMI shielding to the electronic device, and should be capable of retaining multiple expansion cards if so configured.

SUMMARY OF THE INVENTION

Accordingly, the present invention is directed to a card hold down assembly for retaining one or more expansion cards within the chassis of an electronic device such as a computer system, server, photocopier, facsimile machine, printer, or the like. In an exemplary embodiment, the chassis of an electronic device includes an aperture through which the securing tab of an expansion card may extend when the expansion card is inserted within an expansion slot and a tab retaining surface extending from said chassis against which the securing tab may rest when extended through the aperture. A retainer is removably attachable to the chassis for engaging the tab retaining surface to at least partially restrain the securing tab against the tab retaining surface for securing the expansion card in the chassis. A fastener secures the retainer to the tab retaining surface.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 2 is a partial isometric view of the computer chassis illustrated in FIG. 1, wherein retainer of the card hold down assembly is removed from the chassis;

FIGS. 6 and 7 are partial cross-sectional views of the card hold down assembly of the computer chassis shown in FIG.

Figure 1:
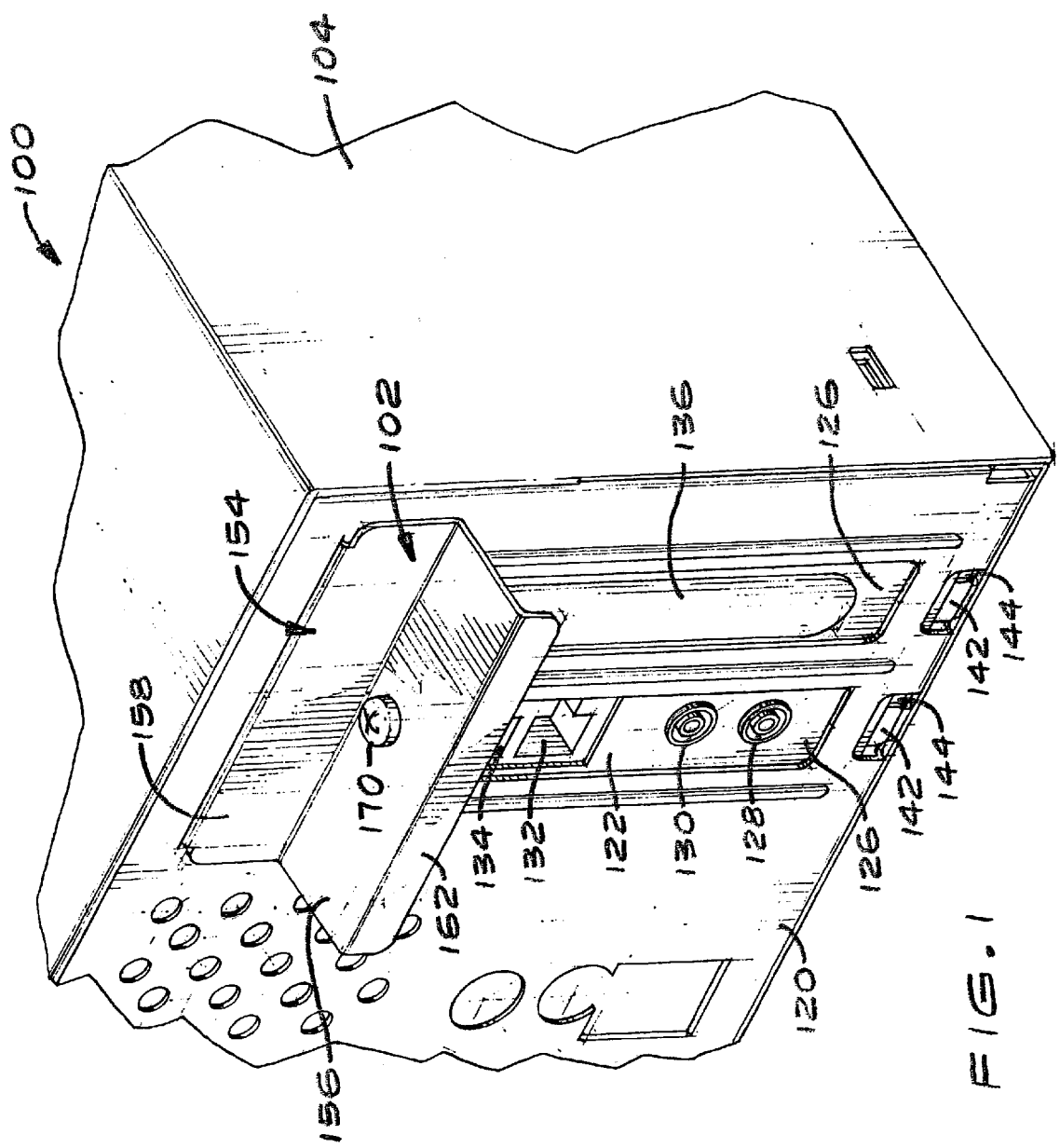
FIG. 1 is a partial isometric view illustrating a computer chassis including a card hold down assembly in accordance with an exemplary embodiment of the present invention.

1, wherein the retainer is shown attached to the chassis in FIG. 6 and removed from the chassis in FIG. 7.

DETAILED DESCRIPTION OF THE INVENTION

Reference will now be made in detail to the presently preferred embodiments of the invention, examples of which are illustrated in the accompanying drawings.

Referring generally to FIGS. 1 through 7, a computer system 100 employing a card hold down assembly 102 in accordance with an exemplary embodiment of the present invention is described. The computer system 100 includes a chassis 104 having an internal card cage assembly 106 providing a plurality of expansion slots 108 each capable of accommodating an expansion card 110 for providing functions or resources to the computer system and/or for extending the computer system's ability to communicate with or control peripheral devices coupled thereto (not shown). Each expansion slot 108 is defined by a connector or socket 112 mounted to a printed circuit board 114 disposed within the computer system's chassis 104. When an expansion card 110 is received in an expansion slot 108, the card's edge connector 116 is seated within the connector 112 of that slot 108 thereby coupling the expansion card 110 to the printed circuit board 114. In FIGS. 1 through 7, a chassis 104 having two expansion slots 108 suitable for receiving a maximum of two expansion cards 110 is shown. However, it will be appreciated that chassis 104 in accordance with exemplary embodiments of the present invention may have only one expansion slot 108, or alternately may have more than two expansion slots depending on design considerations of the computer system 100 or like electronic device.

Figure 3:
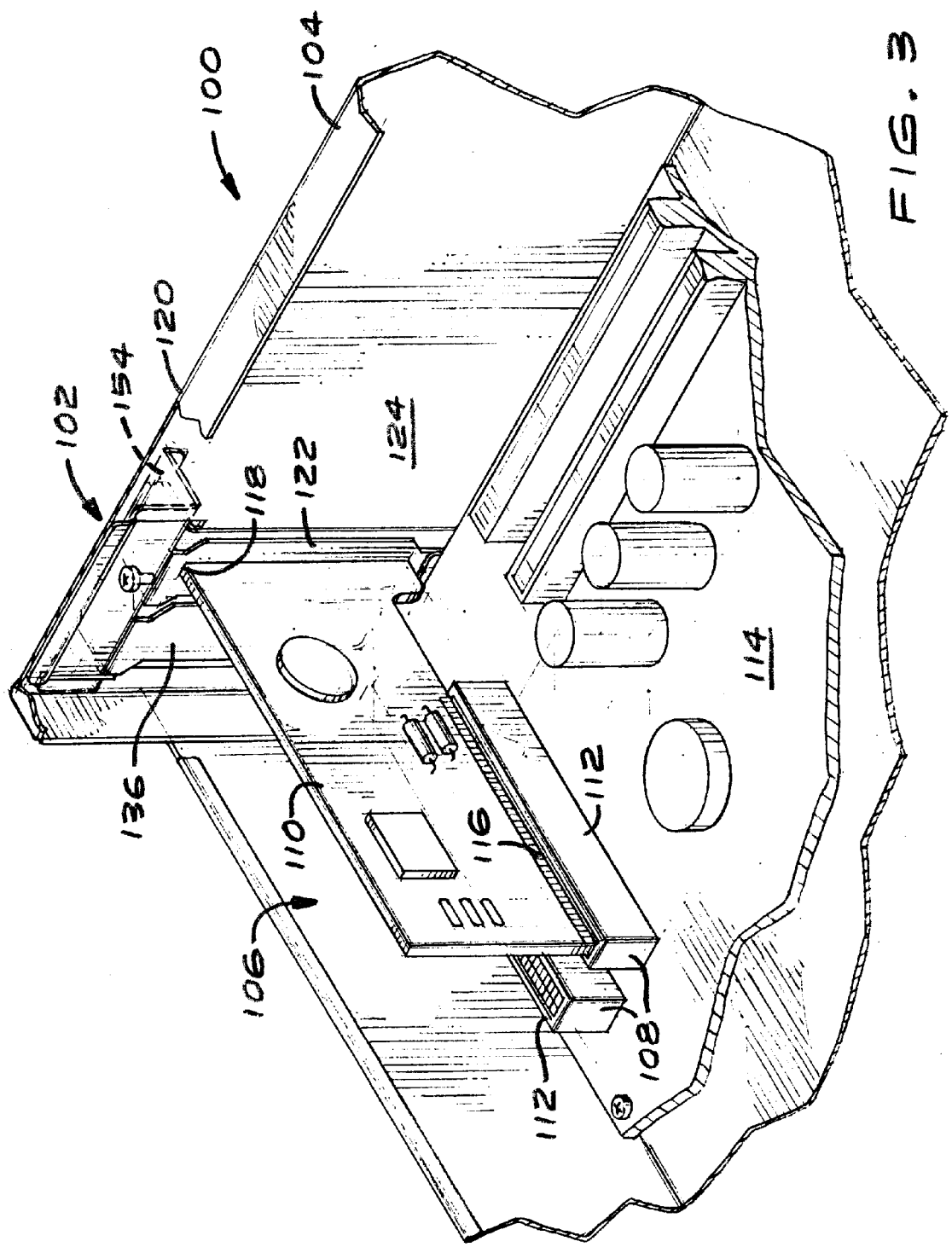
FIG. 3 is a partial isometric view of the computer chassis shown in FIG. 1, further illustrating expansion cards seated within expansion slots of a system board of the computer and retained within the chassis by the card hold down assembly.
Figure 4:
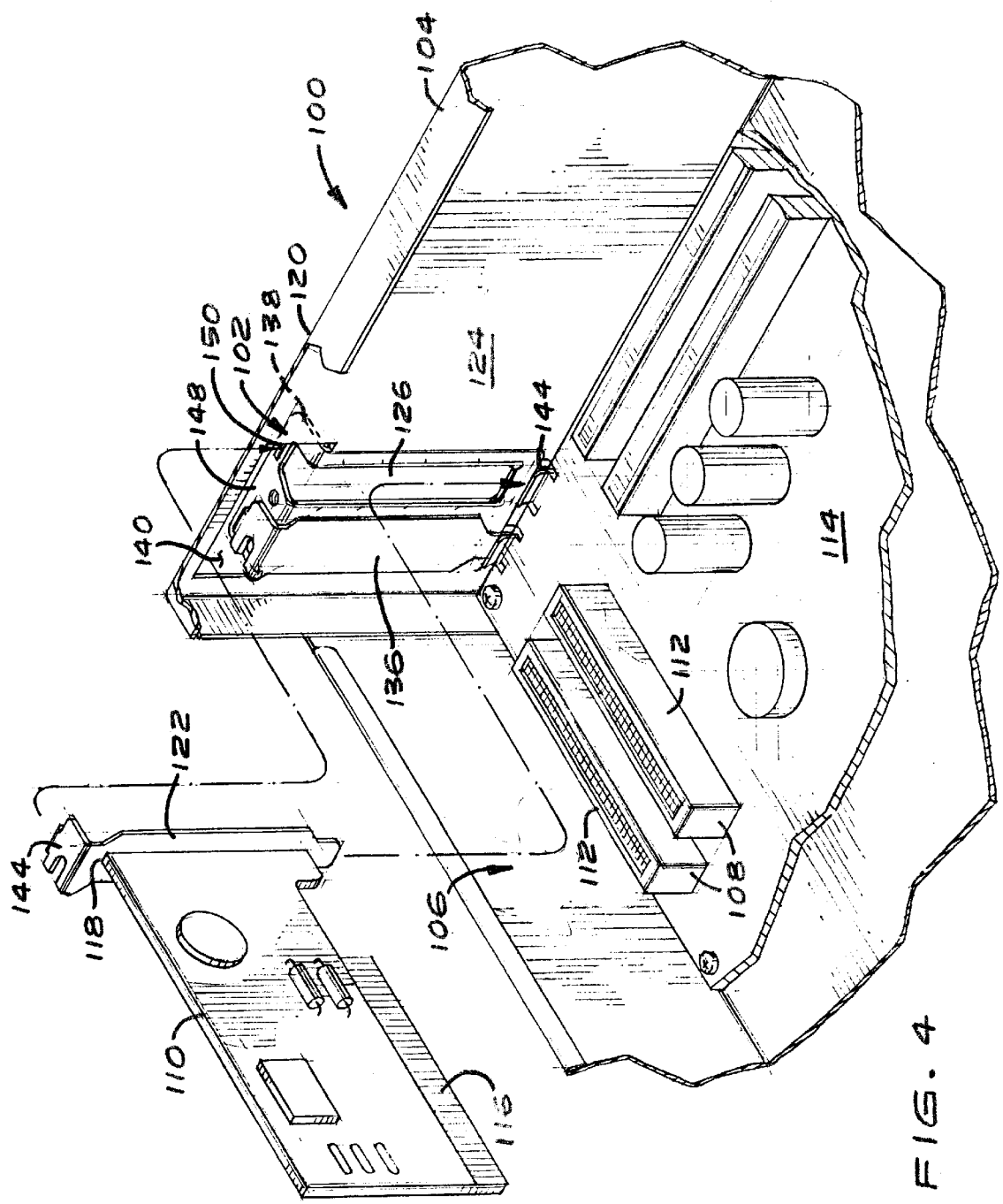
FIG. 4 is a partial isometric view of the computer chassis shown in FIG. 1, further illustrating removal of an expansion card from the computer.

In an exemplary embodiment, shown in FIGS. 3 and 4, printed circuit board 114 may comprise a main system board, motherboard, or the like which contains other electronic components of the computer system 100 such as the system's processor, main memory, bus controller, keyboard controller, video controller, and the like. Alternately, the printed circuit board 114 may comprise a secondary board or daughterboard mounted within the card cage assembly 106 and coupled to the computer system's motherboard. Further, in exemplary embodiments of the invention, expansion slots 108 may comprise connectors 112 suitable for mating with edge connectors 116 having various pin configurations. In such embodiments, the number of pins, and the width and depth of the pins supported by connectors 112 is determined by the interface standard utilized by the computer system bus, e.g., Industry Standard Architecture (ISA), extended industry standard architecture (EISA), Peripheral Component Interconnect (PCI), Micro Channel Architecture (MCA), Video Electronics Standards Association Local Bus (VL-BUS), or the like. For example, the computer system 100 shown in FIGS. 1 through 7, is configured to utilize two low profile PCI expansion cards, however, electronic devices employing the present invention may utilize expansion cards having other configurations depending on the interface standard used.

As shown in FIGS. 3 and 4, expansion slots 108 are oriented so that expansion cards 110 received therein are arranged in a spaced apart, generally parallel array wherein the end edges 118 of the cards 110 are substantially aligned with each other. Preferably, printed circuit board 114 is positioned within the chassis 104 so that expansion slots 108 are also sufficiently close to a wall of the chassis 104, such as the chassis' back panel 120, to allow the mounting bracket 122 of each card 110 received within an expansion slot 108 to rest against the inner surface 124 of the panel 120.

Expansion ports 126 being comprised of elongated, generally rectangular apertures formed in back panel 120 are positioned adjacent to a connector 112 of printed circuit board 114. As shown in FIGS. 3 and 4, when an expansion card 110 is seated within an expansion slot 108, its mounting bracket 122 registers with a corresponding expansion port 126 allowing connectors 128, 130, 132 & 134 supported in the card's mounting bracket 122 to extend through the port 126 so they may be accessed by users of the computer system 100. If an expansion slot 108 is empty, i.e., does not hold an expansion card 110, an expansion port cover 136 may cover the expansion port 126 to prevent environmental contaminants from entering the chassis 104, and/or to shield the computer system's internal electronic components from electromagnetic interference (EMI).

In accordance with an exemplary embodiment of the invention, a card hold down assembly 102 securely retains expansion cards 110 within their respective expansion slots 108 during shipping, transport and use of the computer system 100, while allowing installation and removal of expansion cards 110 utilizing a minimum of fasteners. The card hold down assembly 102 also functions to secure expansion port covers 136 within empty expansion ports 126.

Figure 5:
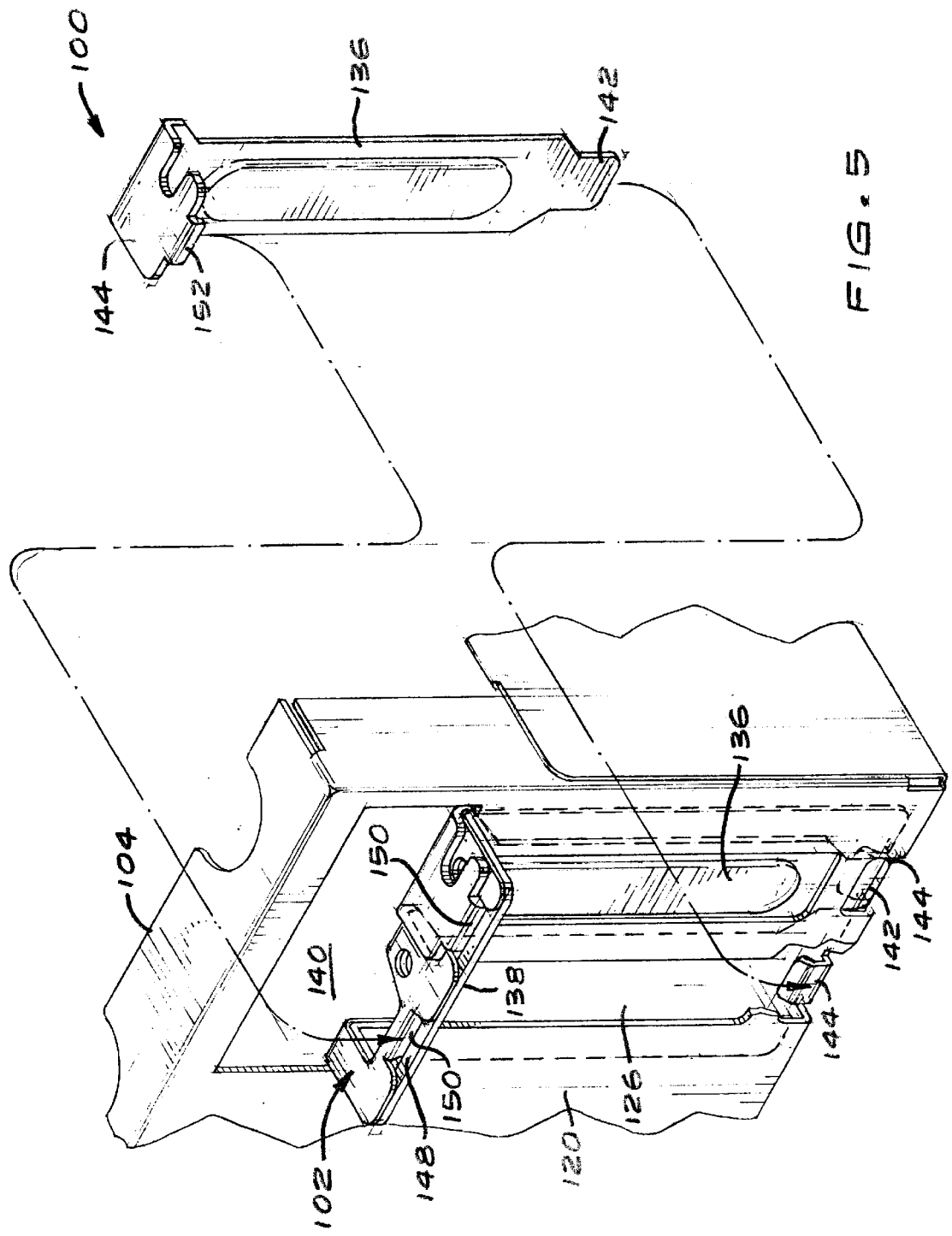
FIG. 5 is a partial isometric view of the computer chassis shown in FIG. 1, further illustrating an expansion port cover for covering expansion ports of the chassis.

As shown in FIGS. 2 and 5, the card hold down assembly 102 includes a ledge or lip 138 extending outwardly from back panel 120 immediately adjacent to the ends of expansion ports 126. An aperture or gap 140 is formed along substantially the entire length of the ledge 146 opposite expansion ports 126. When an expansion card 110 is installed within the card cage assembly 106 (i.e., so that its edge connector 116 is fully seated in a connector 112 of an expansion slot 108 as shown in FIGS. 3 and 4), the card's mounting bracket 122 is positioned against the inner surface 124 of back panel 120 so that downwardly extending tab 142 may engage slot 144, while outwardly extending tab 146 extends through aperture 140 and rests against surface 148 of ledge 138.

Apertures or slots 150 are formed in surface 148. When an expansion card 110 is seated within an expansion slot 108, prongs 152 formed in tabs 146 engage these slots 150 to prevent lateral movement of the expansion card 110 within its expansion slot 108. Prongs 152 and slots 150 may, in the same manner, function to prevent lateral movement of expansion port covers 136 in empty expansion ports 126. Alternately, instead of slots 150, protrusions may be provided to engage notches or holes formed in tabs 146. In exemplary embodiments, such protrusions may be comprised of the extruded rims of small holes formed in the surface 148 of ledge 138, or may be comprised of raised posts, rivets, or like structures depending on design and manufacturing preferences.

Referring now primarily to FIGS. 1, 2, 6 and 7, expansion cards 110 are retained within expansion slots 108 by a retainer 154 mounted to the outside surface of back panel 120. In an exemplary embodiment, the retainer 154 may be attached to the back panel 120, as shown in FIGS. 1 and 7, to engage the tabs 146 of expansion cards 110 for securing the cards 110 within their respective expansion slots 108 (see FIGS. 3 and 4), or removed from the back panel, as shown in FIGS. 2 and 6, so that the tabs 142 are released, allowing expansion cards 110 to be removed and installed within the card cage assembly 106 of chassis 104. When attached, the retainer 154 completely covers aperture 140 to prevent the intrusion of environmental contaminants into the chassis 104 and to reduce electromagnetic interference (EMI) with the computer system's electronic components.

Further, the retainer 154 creates pressure on the tab 146 of each mounting bracket 122, thereby providing good contact with the mounting bracket for EMI shielding.

In an exemplary embodiment, shown in FIGS. 6 and 7, the retainer 154 is comprised of a generally L-shaped bracket 156 formed of a thin sheet of a metal such as steel, aluminum, or the like, or alternately plastic, composite, or the like coated or embed with a metal to provide EMI shielding. The bracket 156 includes a first end 158 having a tab 160 formed therein for engaging the upper edge of aperture 140, and a second end 162 formed to extend over the outer edge 164 of ledge 138. Bracket 156 may further include at least one hole 166 which overlies and registers with a second hole 168 formed in ledge 138 to receive a fastener 170, such as a thumb screw, screw, bolt, or the like. In this manner, retainer 154 may be secured to the ledge 138 so that the tabs 146 are at least partially restrained against surface 148 to prevent up and down movement of the expansion cards 110 (i.e., movement of the expansion cards 110 in directions generally perpendicular to printed circuit board 114 as shown in FIGS. 3 and 4) that could cause the card 110 to become unseated.

In the exemplary embodiment of the invention shown in FIGS. 1 through 7, the retainer 154 has a length suitable for engaging the tabs 146 of two expansion cards 110. However, it will be appreciated that retainers 154 may be provided having lengths suitable for engaging the tab 146 of a single expansion card 110, or alternately more than two expansion cards 110 depending on the number and arrangement of expansion slots within the computer system 100 or like electronic device. In some embodiments where multiple (more than two) expansion cards 110 are retained by a single retainer 154, thereby increasing the length of the retainer 154, it is contemplated that two or more fasteners 170 may be required to adequately secure the retainer to ledge 138.

As shown in FIGS. 1 through 7, expansion cards 110 may be installed within the card cage assembly 106 of chassis 104 by first removing the retainer 154. As shown in FIGS. 1, 2, 6 and 7, his is accomplished by loosening or removing fastener 170 an lifting retainer 154 away from ledge 138 so that the top surface of ledge 138 and aperture 140 are uncovered. If an expansion port cover 136 covers the expansion port 126 where the expansion card is to be placed, it is removed. An expansion card 110 may then be inserted within an expansion slot 108 of the card cage assembly 106 so that its mounting bracket 122 is positioned against a corresponding expansion port 126 in the back panel 120 and its retaining tab 146 extends through aperture 140 and rests substantially against the top surface 148 of ledge 138. The edge connector 116 of expansion card 110 is seated within the expansion slot connector 112. Finally, the retainer 154 is reattached to the back panel 120. As shown in FIGS. 1 and 7, this is accomplished by first inserting tab 160 through aperture 140 so that the base of the tab 160 rests against the upper edge of the aperture 140. The retainer 154 is then rotated so that its second end 162 rests against tab 146 holding tab 146 against surface 148 so that the tab 146 is at least partially restrained against the surface 148. Fastener 170 may then be reinserted through holes 166 & 168 in the retainer 154 and ledge 138 for securing the retainer 154 to the chassis 104.

Expansion cards 110 may be removed from card cage assembly 106 in a similar fashion by first removing fastener 170 an lifting retainer 154 away from ledge 138, thereby releasing the tab 146 from surface 148 of ledge 138. The expansion card 110 to be removed may then be unseating from its expansion slot connector 112 by application of an outward force on the card 110. An expansion port cover 136 may then be inserted in the open expansion port and retainer 154 reattached, if desired.

In FIGS. 1 though 7, computer system 100 is illustrated herein as having a miniature "desktop" style chassis 104, wherein the chassis 104 is short, wide and deep and may be set on one side so that it may be used as a miniature "tower" style chassis. However, it will be appreciated that the card hold down assembly 102 of the present invention may be employed by computer systems 100 employing other styles of chassis or cabinets. For example, the present invention may be employed in computers having tower, mini-tower, or desktop style cabinets (not shown) by one of skill in the art without departing from the scope and spirit of the invention. It should further be recognized that the card hold down assembly 102 of the present invention is not limited to use in computer systems, but may be utilized by any electronic device capable of utilizing expansion cards of the type described herein above. Such electronic devices may include, but are not limited to, servers, photocopiers, facsimile machines, printers, televisions audio equipment, control equipment, medical equipment, and telecommunication equipment. Consequently, modification of such electronic devices to utilize the card hold down assembly 102 described herein by one of skill in the art would also not depart from the scope and spirit of the present invention as defined by the appended claims.

It is believed that the card hold down assembly of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus for retaining an expansion card within the chassis of an electronic device, comprising:

a tab retaining surface extending from an outer surface of the chassis against which a securing tab of a mounting bracket attached to an expansion card may rest when the expansion card is inserted in the chassis, said tab retaining surface being disposed adjacent to a first side of an aperture of the chassis through which the securing tab extends;

a retainer removably attachable to the chassis, said retainer being suitable for engaging said tab retaining surface;

wherein said retainer at least partially restrains said securing tab against said tab retaining surface for securing said expansion card in said chassis, said retainer having a lip for engaging the chassis at a second side of the aperture opposite to the first side of the aperture to provide a fulcrum about which said retainer pivots when said retainer at least partially restrains said securing tab against said tab retaining surface.

2. The apparatus as claimed in claim 1, wherein a plurality of expansion cards are retained within the chassis so that their securing tabs rest on said tab retaining surface and are at least partially restrained against said tab retaining surface by said retainer.

3. The apparatus as claimed in claim 1, further comprising a fastener for securing said retainer to said tab retaining surface.

4. The apparatus as claimed in claim 3, wherein said fastener is a thumbscrew.

5. The apparatus as claimed in claim 1, wherein the chassis of said electronic device further includes a surface having an aperture formed therein for providing access to an expansion card inserted within the chassis.

6. The apparatus as claimed in claim 1, wherein the chassis of said electronic device further includes a surface having an aperture formed therein through which the securing tab of an expansion card may extend to rest against said tab retaining surface when the expansion card is inserted in the chassis, and wherein the retainer is suitable for substantially covering said aperture when said retainer is attached to the chassis.

7. The apparatus as claimed in claim 6, wherein said retainer comprises a generally L-shaped bracket having a first portion suitable for substantially covering said aperture, and a second portion for engaging said tab retaining surface.

8. The apparatus as claimed in claim 7, wherein said first portion includes a tab for engaging the surface to at least partially secure said retainer to said chassis.

9. A chassis for an electronic device, comprising:
  a card cage formed in said chassis suitable for receiving at least one expansion card of the type having a mounting bracket including a securing tab, said card cage including an aperture through which the securing tab may extend;
  a tab retaining surface extending from said chassis against which the securing tab of an expansion card may rest when said expansion card is inserted in said chassis, said tab retaining surface being disposed adjacent to a first side of the aperture; and
  a retainer removably attachable to the chassis, said retainer being suitable for engaging said tab retaining surface;
  wherein said retainer at least partially restrains said securing tab against said tab retaining surface for securing said expansion card in said chassis, said retainer having a lip for engaging the chassis at a second side of the aperture opposite to the first side of the aperture to provide a fulcrum about which said retainer pivots when said retainer at least partially restrains said securing tab against said tab retaining surface.

10. The chassis as claimed in claim 9, wherein a plurality of expansion cards are retained within said card cage so that their securing tabs extend through said aperture to rest on said tab retaining surface and be at least partially restrained against said tab retaining surface by said retainer.

11. The chassis as claimed in claim 9, further comprising a fastener for securing said retainer to said tab retaining surface.

12. The chassis as claimed in claim 11, wherein said fastener is a thumbscrew.

13. The chassis as claimed in claim 9, wherein said chassis further comprises a surface having an aperture formed therein for providing access to an expansion card inserted within said card cage.

14. The chassis as claimed in claim 9, wherein said retainer is suitable for substantially covering said aperture in said card cage when said retainer is attached to said chassis.

15. The chassis as claimed in claim 14, wherein said retainer comprises a generally L-shaped bracket having a first portion suitable for substantially covering said aperture, and a second portion for engaging said tab retaining surface.

16. The chassis as claimed in claim 15, wherein said first portion includes a tab for engaging the surface to at least partially secure said retainer to said chassis.

17. An electronic device, comprising:
  a chassis suitable for receiving at least one expansion card of the type having a mounting bracket including a securing tab, said chassis including an aperture through which the securing tab may extend;
  a tab retaining surface extending from said chassis against which the securing tab of an expansion card may rest when said expansion card is inserted in said chassis, said tab retaining surface being disposed adjacent to a first side of the aperture; and
  a retainer removably attachable to the chassis, said retainer being suitable for engaging said tab retaining surface;
  wherein said retainer at least partially restrains said securing tab against said tab retaining surface for securing said expansion card in said chassis, said retainer having a lip for engaging the chassis at a second side of the aperture opposite to the first side of the aperture to provide a fulcrum about which said retainer pivots when said retainer at least partially restrains said securing tab against said tab retaining surface.

18. The electronic device as claimed in claim 17, wherein a plurality of expansion cards are retained within said chassis so that their securing tabs extend through said aperture to rest on said tab retaining surface and be at least partially restrained against said tab retaining surface by said retainer.

19. The chassis as claimed in claim 17, further comprising a fastener for securing said retainer to said tab retaining surface.

20. The electronic device as claimed in claim 19, wherein said fastener is a thumbscrew.

21. The electronic device as claimed in claim 17, wherein said chassis further comprises a surface having an aperture formed therein for providing access to an expansion card inserted within said card cage.

22. The electronic device as claimed in claim 17, wherein said retainer is suitable for substantially covering said aperture in said chassis when said retainer is attached to said chassis.

23. The electronic device as claimed in claim 22, wherein said retainer comprises a generally L-shaped bracket having a first portion suitable for substantially covering said aperture, and a second portion for engaging said tab retaining surface.

24. The electronic device as claimed in claim 23, wherein said first portion includes a tab for engaging the surface to at least partially secure said retainer to said chassis.

* * * * *